United States Patent
Jung

(10) Patent No.: US 7,631,238 B2
(45) Date of Patent: Dec. 8, 2009

(54) METHOD OF TESTING A MULTICHIP

(75) Inventor: Jin-Kook Jung, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/985,191

(22) Filed: Nov. 14, 2007

(65) Prior Publication Data

US 2008/0112242 A1    May 15, 2008

(30) Foreign Application Priority Data

Nov. 14, 2006  (KR) ...................... 10-2006-0112371

(51) Int. Cl.
*G01R 31/28* (2006.01)
(52) U.S. Cl. .................................... 714/738
(58) Field of Classification Search ................. 714/738
See application file for complete search history.

(56) References Cited

U.S. PATENT DOCUMENTS

| | | | |
|---|---|---|---|
| 6,711,042 B2 | 3/2004 | Ishikawa | |
| 6,732,304 B1 | 5/2004 | Ong | |
| 6,810,492 B2 * | 10/2004 | Weber et al. | ................... 714/8 |
| 6,925,018 B2 * | 8/2005 | Tatsumi | ...................... 365/201 |
| 6,988,232 B2 * | 1/2006 | Ricchetti et al. | ............ 714/736 |
| 7,171,596 B2 * | 1/2007 | Boehler | ....................... 714/718 |
| 7,360,129 B2 * | 4/2008 | Tang | ........................... 714/718 |
| 2003/0043612 A1 | 3/2003 | Ishikawa | |
| 2004/0006729 A1 * | 1/2004 | Pendurkar | ................... 714/733 |
| 2005/0086564 A1 * | 4/2005 | Frankowsky et al. | ........ 714/718 |
| 2008/0052573 A1 * | 2/2008 | Pekny | ........................ 714/724 |

FOREIGN PATENT DOCUMENTS

| | | |
|---|---|---|
| JP | 10-82825 | 3/1998 |
| KR | 2003-0021113 | 3/2003 |
| KR | 2003-0082847 | 10/2003 |
| KR | 10-2004-0065776 | 7/2004 |

* cited by examiner

*Primary Examiner*—James C Kerveros
(74) *Attorney, Agent, or Firm*—Mills & Onello, LLP

(57) ABSTRACT

A multichip and method of testing a multichip, the multichip including a control chip having a central processing unit (CPU) and a plurality of memories, each memory of the plurality of memories storing information related to testing the multichip, comprises connecting one of the memories to the control chip; reading, by the CPU, stored memory information from the connected one of the memories to confirm the connected one of the memories; generating a test pattern relating to the connected one of the memories confirmed by the CPU, and testing the connected one of the memories according to the test pattern.

20 Claims, 5 Drawing Sheets

|  | TYPE | SIZE | I/O |
|---|---|---|---|
| 0000 | DRAM | 128M | 8bit |
| 0001 | SRAM | 256M | 16bit |
| 0010 | ROM | 512M | 32bit |
| 0011 | NAND | 1024M | 64bit |
| 0100 | NOR | 2048M | 128bit |
| 0101 | ONENAND |  |  |
| 0111 | MOVINAND |  |  |
| ⋮ |  |  |  |
| 1111 |  |  |  |

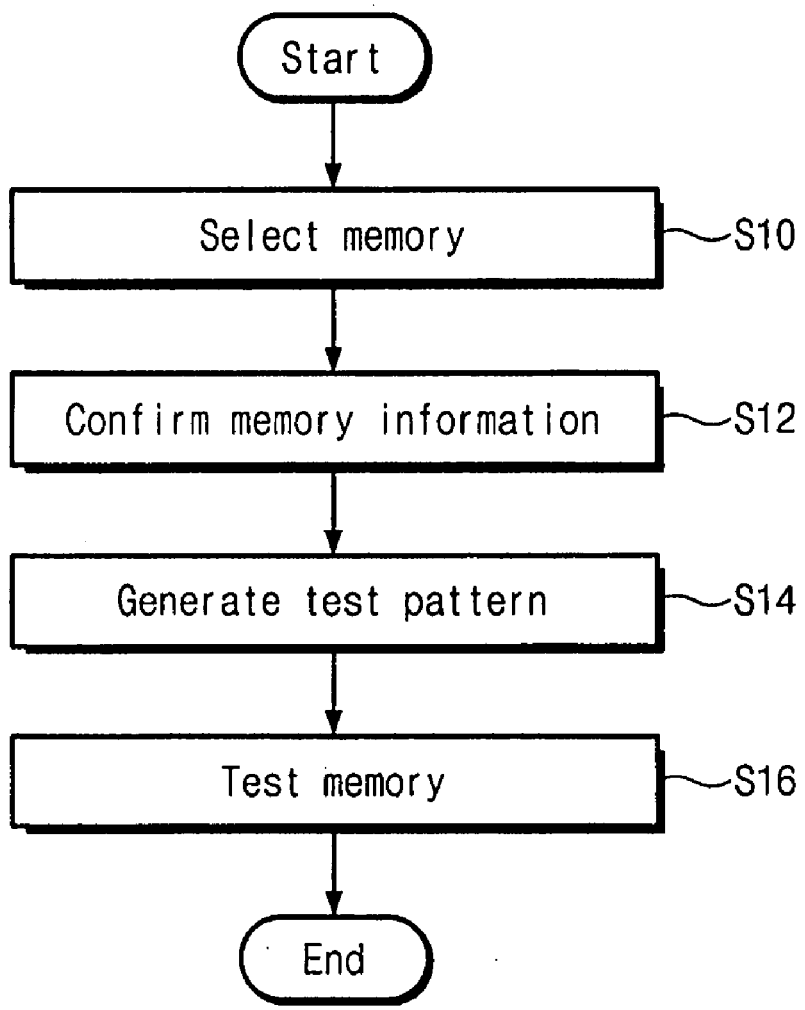

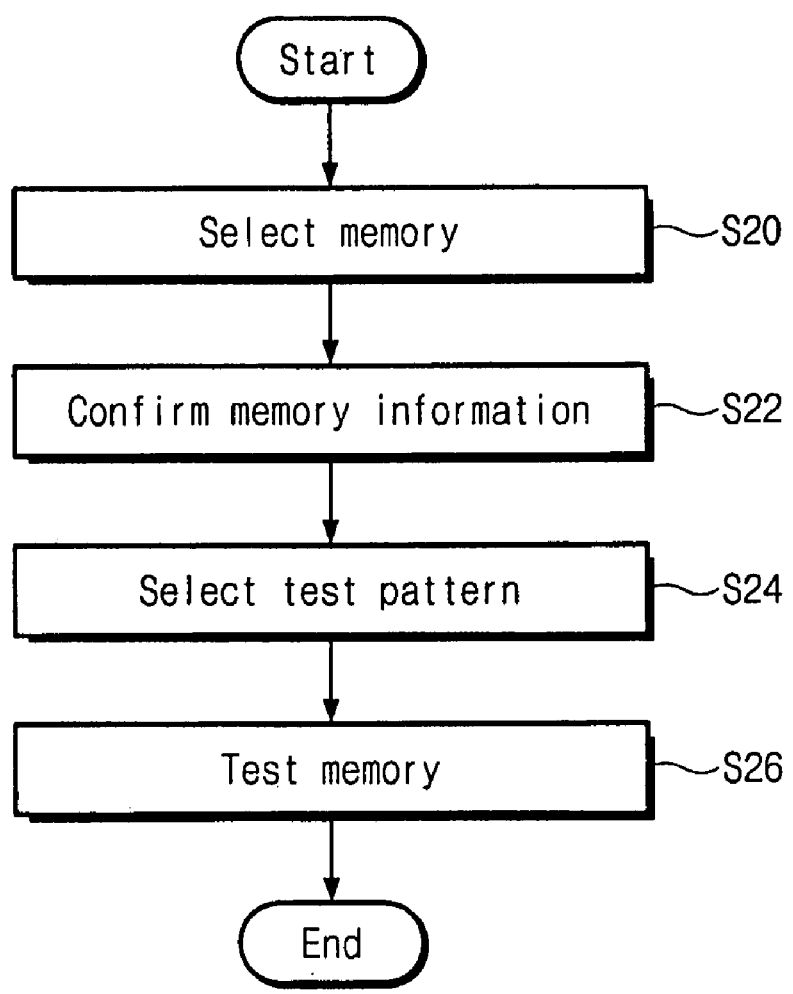

METHOD OF TESTING A MULTICHIP

CROSS-REFERENCE TO RELATED APPLICATIONS

This U.S. non-provisional patent application claims priority under 35 U.S.C. § 119 of Korean Patent Application No. 10-2006-0112371, filed in the Korean Intellectual Property Office on Nov. 14, 2006, the entire contents of which are hereby incorporated by reference in their entirety.

BACKGROUND OF THE INVENTION

1. Field of the Invention

The present invention described herein relates to a multichip, and more particularly, to a multichip capable of testing a memory and a method of testing the multichip.

2. Description of the Related Art

System-in-Package (SiP), Multichip Package (MCP), and Package-on-Package (POP) technologies are widely used to achieve low power consumption and miniaturization of electronic application products such as the latest portable smart phones, personal digital assistants (PDAs), navigation devices, etc. FIG. 1 is a block diagram of a SiP 10 in embodiments of a multichip. Referring to FIG. 1, the SiP 10 combines a plurality of Large Scale Integrated circuits (LSIs) into a single package to form a system. FIG. 2 is a block diagram of a MCP 20 in embodiments of a multichip. Referring to FIG. 2, the MCP 20 stacks various kinds of memory chips in one package. The MCP 20 combines necessary memories according to application to realize various functions. FIG. 3 is a block diagram of a POP 30 in embodiments of a multichip. Referring to FIG. 3, the POP 30 stacks two Ball Grid Array (BGA) packages sequentially. A lower BGA package includes a metal ball or a bump arranged therebelow, and includes a footprint (land) at the top surface to receive a corresponding upper BGA package.

According to the above technologies, more than two chips such as a single control chip and a single memory chip are stacked according to a stack process. The stack process is performed using a plurality of acceptable single chips, which are selected according to a test. However, even though each of the selected single chips is acceptable, defects relating to timing, load, and resistance may occur at an interface between the chips as a result of the stacking process.

However, a package level test is not performed on a typical multichip after the stack process. Additionally, a test pattern is also limited while testing a single chip.

SUMMARY OF THE INVENTION

The present invention provides a multichip capable of performing a package level test, and a method of testing the multichip.

In one aspect, the present invention is directed to a method of testing a multichip, the multichip including a control chip having a central processing unit (CPU) and a plurality of memories, each memory of the plurality of memories storing information related to testing the multichip. The method comprises connecting one of the memories to the control chip; reading, by the CPU, stored memory information from the connected one of the memories to confirm the connected one of the memories; generating a test pattern relating to the connected one of the memories confirmed by the CPU; and testing the connected one of the memories according to the test pattern.

In an embodiment, the memories comprise ID registers that store the memory information.

In an embodiment, the memories are connected to the control chip using chip selection pins of the memories.

In an embodiment, the chip selection pins float from the control chip while testing the control chip.

In an embodiment, a test board connects the chip selection pins of the plurality of memories to the control chip while the memories are tested.

In an embodiment, the CPU generates chip selection signals to activate the memories.

In an embodiment, each memory comprises data pins to read the memory information through the ID registers of the memories.

In an embodiment, the ID registers comprise information related to type, size and input/output (I/O) of the memories.

In an embodiment, the CPU comprises a program logic to generate various test patterns according to the type, size and I/O of the memories, which are read from the ID registers.

In an embodiment, the control chip comprises a register that stores the test pattern.

In an embodiment, the CPU tests the memory using the test pattern stored in the register.

In an embodiment, the control chip comprises a chip selection circuit that connects the chip selection pins to the CPU.

In an embodiment, the CPU generates a chip selection signal and delivers it to the chip selection circuit, and the chip selection circuit activates the memories in response to the chip selection signal.

In an embodiment, each memory comprises data pins to read the memory information through the ID registers of the memories.

In an embodiment, the ID registers comprise information related to type, size and I/O of the memories.

In an embodiment, the CPU comprises a program logic to generate various test patterns according to the type, size and I/O of the memories, which are read from the ID registers.

In an embodiment, the control chip comprises a register that stores the test pattern.

In an embodiment, the CPU tests the memory using the test pattern stored in the register.

In another aspect, the present invention is directed to a method of testing a multichip, the multichip including a control chip with a central processing unit (CPU) and a plurality of memories, each memory of the plurality of memories storing information related to testing the multichip, comprising connecting one of the memories to the control chip; reading, by the CPU, stored memory information from the connected one of the memories; selecting a test pattern relating to the connected one of the memories that is confirmed by the CPU; and testing the connected one of the memories according to the generated test pattern.

In an embodiment, the memories comprise ID registers that store the memory information.

In an embodiment, the memories are connected to the control chip using chip selection pins of the memories.

In an embodiment, the chip selection pins float from the control chip while testing the control chip.

In an embodiment, a test board connects the chip selection pins of the plurality of memories to the control chip while testing the memories.

In an embodiment, the control chip comprises a chip selection circuit connecting the chip selection pins to the CPU.

In an embodiment, the CPU generates a chip selection signal and delivers it to the chip selection circuit, and the chip selection circuit activates the memories in response to the chip selection signal.

In another aspect, the present invention is directed to a multichip comprising a plurality of memories, each memory of the plurality of memories storing memory information; and a control chip testing the memories. The control chip comprises a register that stores a test pattern, and a CPU that reads memory information stored in the memories to confirm a memory to be tested, that generates a test pattern appropriate for the confirmed memory to deliver the generated test pattern to the register, and that uses the test pattern stored in the register to test the confirmed memory.

In an embodiment, the memories comprise ID registers that store the respective memory information.

In an embodiment, the memory information comprises type, size, and I/O of the memories.

In an embodiment, the control chip comprises a chip selection circuit that electrically connects the memories to the CPU.

In an embodiment, the chip selection circuit respectively connects the chip selection pins of the memories to the CPU in response to a chip selection signal generated in the CPU.

In an embodiment, the chip selection pins float from the CPU in response to the chip selection signal while testing the control chip.

In an embodiment, the CPU is an Advanced RISC Machine (ARM) core.

BRIEF DESCRIPTION OF THE DRAWINGS

The accompanying figures are included to provide a further understanding of the present invention, and are incorporated in and constitute a part of this specification. The embodiments depicted therein are provided by way of example, not by way of limitation, wherein like reference numerals refer to the same or similar elements. The drawings are not necessarily to scale, emphasis instead being placed upon illustrating aspects of the invention.

FIG. 7 is a flowchart illustrating a memory testing method of a multichip according to an embodiment of the present invention.

FIG. 8 is a flowchart illustrating another memory testing method of a multichip according to an embodiment of the present invention.

DETAILED DESCRIPTION OF PREFERRED EMBODIMENTS

Illustrative embodiments of the present invention will be described below in more detail with reference to the accompanying drawings. The present invention may, however, be embodied in different forms and should not be construed as limited to the embodiments set forth herein. Rather, these embodiments are provided so that this description will be thorough and complete, and will fully convey the scope of the present invention to those skilled in the art. While describing these embodiments, detailed descriptions of well-known items, functions, or configurations are typically omitted for conciseness.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, steps, operations, elements, and/or components, but do not preclude the presence or addition of one or more other features, steps, operations, elements, components, and/or groups thereof.

Figure 4:
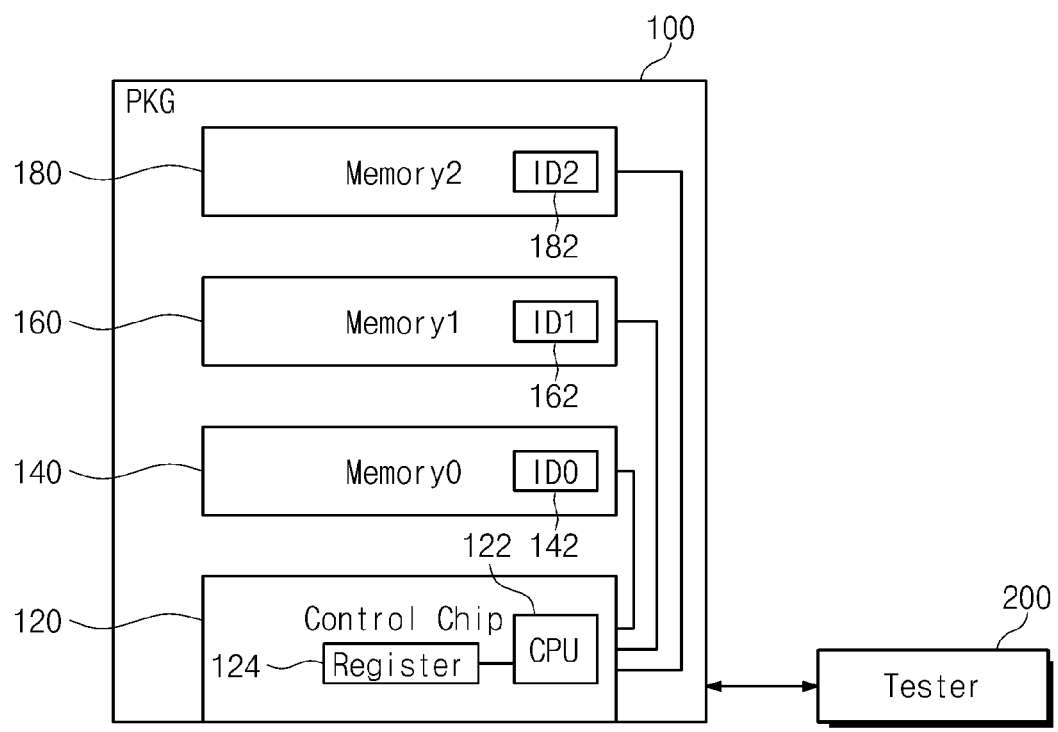
FIG. 4 is a block diagram of a multichip according to an embodiment of the present invention.

FIG. 4 is a block diagram of a multichip 100 according to an embodiment of the present invention. Referring to FIG. 4, the multichip 100 includes a control chip 120 and memories 140, 160, and 180.

The control chip 120 of the multichip 100 includes a CPU 122 and a register 124. The CPU 122 is a central processing unit and controls operations of the multichip 100. The CPU 122 tests the memories 140, 160, and 180 according to a test pattern stored in the register 124, and, in an embodiment, can be an Advanced RISC Machine (ARM) core. In an embodiment, the ARM core is a 32-bit RISC Processor, for example, developed by Advanced RISC Machine in England, and includes a well-developed environment, which is appropriate for lower power consumption and abundant application software. The ARM core is widely used in electronic devices such as mobile phones, PDAs, etc., which require low power consumption.

The register 124 stores a test pattern for testing the memories 140, 160, and 180. In an embodiment, the CPU 122 generates the test pattern. Here, the CPU 122 confirms a memory to be tested, generates the test pattern suitable for the confirmed memory, and then stores the test pattern in the register 124. The register 124 may store a plurality of test patterns for testing various memories, for example, memories 140, 160, 180. In another embodiment, the test pattern stored in the register 124 can be delivered from an external tester 200 as illustrated in FIG. 4.

Functions of the tester 200 may vary according to whether the test pattern is stored in the register 124 or is generated elsewhere, for example, generated by the CPU 122. If the test pattern is stored in the register 124, the tester 200 can select the test patterns that are respectively appropriate for the memories 140, 160, and 180. If the test pattern is generated by the CPU 122, the tester 200 activates a function that tests the memories 140, 160, and 180. In other cases, the tester 200 generates the test pattern and the tester 200 delivers the test pattern to the control chip 120.

In embodiments, the memories 140, 160, and 180 can be one of SRAM, ROM, DRAM, NAND FLASH, NOR FLASH, ONENAND, and MOVINAND. The memories 140, 160, and 180 include ID registers 142, 162, and 182 with their own original information therein. The ID registers 142, 162, and 182 can include information pertaining to characteristics of the respective memories 140, 160, 180, for example, information relating to types, sizes, and I/Os of respective memories 140, 160, and 180. In an embodiment, the CPU 122 of the control chip 120 reads stored information of the ID registers 142, 162, and 182, confirms the respective memories 140, 160, and 180, and then generates test patterns necessary for a test.

Figures 5, 6:
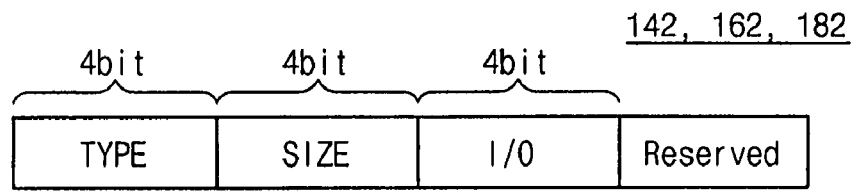
FIG. 5 is a view of an ID register of a memory according to an embodiment of the present invention.
FIG. 6 is a table of code values according to a memory type, a size, and I/O of the ID register of FIG. 5.

FIG. 5 is a view of ID registers 142, 162, and 182 of a memory according to an embodiment of the present invention. Referring to FIG. 5, the ID registers 142, 162, and 182 store information relating to the type, size, and I/O of a memory by a code value of a 4-bit unit. The 4-bit code values of the ID register 142, 162, and 182 may be written during a memory manufacturing process.

FIG. 6 is a table of code values according to the type, size, and I/O of the ID registers 142, 162, and 182 of FIG. 5. Referring to FIG. 6, for example, information related to a 1 G NAND flash memory with 32-bit I/O is stored in the ID registers 142, 162, and 182 as follows. When the memory type is a NAND flash memory, "0011" is stored in the TYPE field of ID registers 142, 162, 182. Since the size is 1 G, "0011" is stored in the SIZE field of ID registers 142, 162, 182. Since the I/O is 32-bit I/O, "0010" is stored in the I/O field of ID registers 142, 162, 182. Accordingly, "001100110010" is stored in the ID registers 142, 162, and 182. When testing memories in a multichip, the CPU 122 of the control chip 120 reads the stored "001100110010" in the ID registers 142, 162, and 182 to confirm that memories 140, 160, 180 are 32-bit 1 G NAND flash memories.

The memories 140, 160, and 180 of the multichip 100 are connected to the control chip 120 through respective chip selection pins (not shown). In most of the multichips 100, the chip selection pins of the memory float between the memory and control chip 120 for testing the control chip 120. Accordingly, while testing a memory in a multichip, a test board needs to connect the chip selection pins to the control chip 120.

In an embodiment, the multichip 100 can include an additional chip selection circuit (not shown) in the control chip 120 to eliminate the above-mentioned limitations. The chip selection circuit determines an electrical connection between the control chip 120 and the memory. The chip selection circuit makes all the memories float when testing the control chip 120. On the other hand, the chip selection circuit selectively connects the memories 140, 160, and 180 according to the control of the CPU 122.

The multichip 100 of the present invention includes an ID register storing information for the memory. The CPU 122 of the control chip 120 reads the stored value in the ID register to confirm information, and then generates a test pattern for the memory to perform a memory test.

FIG. 7 is a flowchart illustrating a memory testing method of a multichip 100 according to an embodiment of the present invention. Referring to FIGS. 4 and 7, a method of testing a memory of the multichip 100 is as follows.

In operation S10, the multichip 100 selects a memory to be tested. A method of selecting a memory may vary according to how the chip selection pins (not shown) of the memories 140, 160, and 180 are connected to the control chip 120. In a structure of a typical multichip 100, a test board (not shown) connects the chip selection pins of the memories 140, 160, and 180 with the control chip 120. At this point, the CPU 122 of the control chip 120 sequentially enables all chip selection signals to search for the memories connected through the test board. If the chip selection circuit is included in the control chip 120 of the multichip 100, the CPU 122 of the control chip 120 sequentially selects one or more of the memories 140, 160, and 180. At this point, the control chip 120 operates in a test mode in response to a signal delivered from the external tester 200.

In operation S12, the information for the memory selected in the operation S11 is confirmed. The memories 140, 160, and 180 of the multichip 100 respectively include the ID registers 142, 162, and 182. The CPU 122 of the control chip 120 reads a value in the ID register of the memory selected in the operation S10. Referring to FIGS. 5 and 6, if the value from the ID register is "000100110011", this memory is a 64-bit 1 G SRAM.

In operation S14, a test pattern is generated according to the memory information confirmed in the operation S12. The CPU 122 of the control chip 120 generates the test pattern according to the confirmed memory information. A memory test in a single product uses a Built-In Self-Test (BIST). However, when using the BIST, types of the test patterns are limited. On the contrary, according to the memory test of the present invention, since the test pattern is generated in the CPU 122, more various test patterns can be utilized. The test pattern generated in the CPU 122 is stored in the register 124.

In operation S16, a selected memory is tested according to the test pattern generated in the operation S14.

Figure 1:
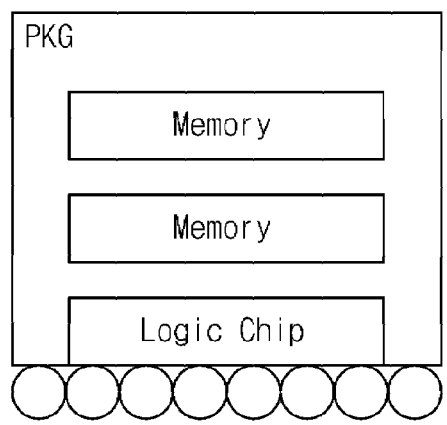
FIG. 1 is a block diagram of SiP in embodiments of a multichip.
Figure 2:
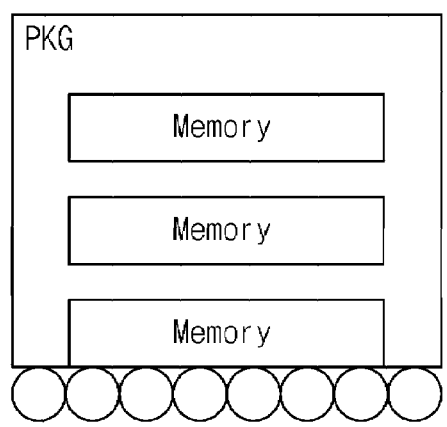
FIG. 2 is a block diagram of MCP in embodiments of a multichip.
Figure 3:
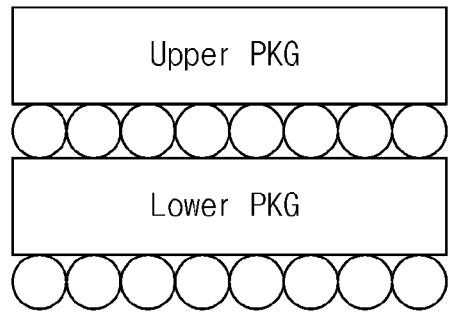
FIG. 3 is a block diagram of POP in embodiments of a multichip.

The multichip 100 of the present invention includes memories 140, 160, and 180. As illustrated in FIG. 2, the number of memories is includes three memories for convenient description. The CPU 122 of the control chip 120 sequentially selects and tests the memories 140, 160, and 180 in response to a test signal of the tester 200, and thus, all three memories 140, 160, and 180 are tested.

FIG. 8 is a flowchart illustrating another memory testing method of a multichip 100 according to an embodiment of the present invention. The multichip 100 stores a test pattern in a register before a test. Referring to FIGS. 2 and 8, a method of testing a multichip 100 is as follows.

In operation S20, the multichip 100 selects a memory to be tested, similar to that shown in FIG. 7. A method of selecting a memory may vary according to how the chip selection pins (not shown) of the memories 140, 160, and 180 are connected to the control chip 120. In a structure of a typical multichip 110, a test board (not shown) connects the chip selection pins of the memories 140, 160, and 180 with the control chip 120. At this point, the CPU 122 of the control chip 120 sequentially enables all chip selection signals to search for the memories connected through the test board. If the chip selection circuit is included in the control chip 120 of the multichip 100, the CPU 122 of the control chip 120 sequentially selects the memories 140, 160, and 180. At this point, the control chip 120 operates in a test mode in response to a signal delivered from the external tester 200.

In operation S22, the information for the memory selected in the operation S20 is confirmed, similar to that shown in FIG. 7. The memories 140, 160, and 180 of the multichip 100 respectively include the ID registers 142, 162, and 182. The CPU 122 of the control chip 120 reads a value in the ID register of the memory selected in the operation S20. Referring to FIGS. 5 and 6, if the value from the ID register is "000100110011", this memory is a 64-bit 1 G SRAM.

In operation S24, in an embodiment, a test pattern is selected by the tester 200 that is appropriate for the 64-bit 1 B SRAM memory. In another embodiment, a test pattern is generated by the tester 200, and delivered by the tester 200 to the control chip 120.

In operation S26, the selected memory is tested according to the test pattern selected in the operation S24.

The multichip 100 of the present invention includes the control chip 120 with the CPU 122, and the memories 140, 160, and 180 with the ID registers that store memory information. The CPU 122 of the control chip 120 reads stored information in the respective ID) registers of the memories 140, 160, and 180 to generate a test pattern appropriate for a corresponding memory, and then performs a memory test according to the memory pattern.

According to the present invention, the multichip includes the ID registers in the respective memories, confirms the memory through information stored in the ID register, and generates an appropriate test pattern in order to perform a memory test. Accordingly, the multichip of the present invention may perform various test patterns according to information in the ID registers.

While this invention has been particularly shown and described with references to preferred embodiments thereof, it will be understood to those skilled in the art that various changes in form and details may be made herein without departing from the spirit and scope of the invention as defined in the appended claims.

What is claimed is:

1. A method of testing a multichip, the multichip including a control chip having a central processing unit (CPU) and a plurality of memories, each memory of the plurality of memories storing information related to testing the multichip, the method comprising:
   connecting one of the memories to the control chip;
   reading, by the CPU, stored memory information from the connected one of the memories to confirm the connected one of the memories;
   generating, by the CPU, a test pattern relating to the connected one of the memories confirmed by the CPU; and
   testing, by the CPU, the connected one of the memories according to the test pattern, wherein the memories include at least two memories whose types are different from each other.

2. The method of claim 1, wherein the memories comprise ID registers that store the memory information.

3. The method of claim 2, wherein the memories are connected to the control chip using chip selection pins of the memories.

4. The method of claim 3, wherein the chip selection pins float from the control chip while testing the control chip.

5. The method of claim 4, wherein a test board connects the chip selection pins of the plurality of memories to the control chip while the memories are tested.

6. The method of claim 5, where the CPU generates chip selection signals to activate the memories.

7. The method of claim 6, wherein the memories comprise data pins to read the memory information through the ID register of the memory.

8. The method of claim 6, wherein the ID registers comprise information related to type, size and input/output (I/O) of the memories.

9. The method of claim 8, wherein the CPU comprises a program logic to generate various test patterns according to the type, size and I/O of the memories, the test patterns being read from the ID register.

10. The method of claim 9, wherein the control chip comprises a register that stores the test pattern.

11. The method of claim 10, wherein the CPU tests the memories using the test pattern stored in the register.

12. The method of claim 4, wherein the control chip comprises a chip selection circuit that connects the chip selection pins to the CPU.

13. The method of claim 12, wherein the CPU generates a chip selection signal and delivers it to the chip selection circuit, and the chip selection circuit activates the memories in response to the chip selection signal.

14. A method of testing a multichip, the multichip including a control chip with a central processing unit (CPU) and a plurality of memories, each memory of the plurality of memories storing information related to testing the multichip, the method comprising:
   connecting one of the memories to the control chip;
   reading, by the CPU, stored memory information from the connected one of the memories to confirm the connected one of the memories;
   selecting a test pattern generated by the CPU relating to the connected one of the memories that is confirmed by the CPU; and
   testing, by the CPU, the connected one of the memories according to the test pattern, wherein the memories include at least two memories whose types are different from each other.

15. The method of claim 14, wherein the memories comprise ID registers that store the memory information.

16. The method of claim 14, wherein the memories are connected to the control chip using chip selection pins of the memories.

17. The method of claim 16, wherein the chip selection pins float from the control chip while testing the control chip.

18. The method of claim 17, wherein a test board connects the chip selection pins of the plurality of memories to the control chip while testing the memories.

19. The method of claim 17, wherein the control chip comprises a chip selection circuit connecting the chip selection pins to the CPU.

20. The method of claim 19, wherein the CPU generates a chip selection signal and delivers it to the chip selection circuit, and the chip selection circuit activates the memories in response to the chip selection signal.

* * * * *